United States Patent
Katashima et al.

(12) 
(10) Patent No.: US 6,825,261 B2
(45) Date of Patent: Nov. 30, 2004

(54) ANTISTATIC COAT, THERMAL TRANSFER SHEET HAVING ANTISTATIC PROPERTY AND ANTISTATIC AGENT

(75) Inventors: Akihiko Katashima, Kanagawa-ken (JP); Norikatsu Ono, Tokyo-to (JP); Masayuki Ando, Tokyo-to (JP); Shigeki Chujo, Tokyo-to (JP); Masayoshi Tanaka, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 456 days.

(21) Appl. No.: 09/945,468

(22) Filed: Aug. 30, 2001

(65) Prior Publication Data

US 2002/0032271 A1 Mar. 14, 2002

Related U.S. Application Data

(62) Division of application No. 09/378,797, filed on Aug. 23, 1999, now Pat. No. 6,310,133, which is a division of application No. 08/918,233, filed on Aug. 25, 1997, now Pat. No. 5,968,871.

(30) Foreign Application Priority Data

| Aug. 26, 1996 | (JP) | ............................ P8-240983 |
| Aug. 26, 1996 | (JP) | ............................ P8-240984 |
| Mar. 26, 1997 | (JP) | ............................ P9-90029 |
| Apr. 16, 1997 | (JP) | ............................ P9-113614 |

(51) Int. Cl.$^7$ ................................. C08K 3/04

(52) U.S. Cl. .................... 524/495; 428/333; 428/423.1; 428/480; 428/500

(58) Field of Search .................................. 524/495, 496; 428/333, 423.1, 480, 500

(56) References Cited

U.S. PATENT DOCUMENTS 5,498,372 A * 3/1996 Hedges ....................... 252/511

OTHER PUBLICATIONS

Handbook of Fillers for Plastics, Katz ed., p. 394. (1987).*

* cited by examiner

*Primary Examiner*—Edward J. Cain
(74) *Attorney, Agent, or Firm*—Ladas & Parry LLP

(57) ABSTRACT

An antistatic coat of the present invention coats a surface of a base body so as to prevent accumulation of electric charges in the base body, the antistatic coat having a multi-layers structure comprising at least one antistatic layer, and the antistatic layer being disposed between the base body and an outermost surface layer of the antistatic coat. On the back surface side of a thermal transfer sheet, there is formed a heat resistant slip layer through an antistatic layer, or a heat resistant slip layer containing a conductive material. Sulfonated polyaniline, a conductive carbon black having primary particle size of up to 40 nm and specific surface of at least 130 m$^2$/g, and a conductive carbon black having an oil absorption of at least 75 ml/100 g are favorable conductive material.

12 Claims, 5 Drawing Sheets

ANTISTATIC COAT, THERMAL TRANSFER SHEET HAVING ANTISTATIC PROPERTY AND ANTISTATIC AGENT

This is a division of U.S. Ser. No. 09/378,797 filed Aug. 23, 1999, now U.S. Pat. No. 6,310,133, issued on Oct. 30, 2001: which is a division of U.S. Ser. No. 08/918,233 filed Aug. 25, 1997, now U.S. Pat. No. 5,968,871, issued on Oct. 19, 1999.

BACKGROUND OF THE INVENTION

1. Field of the Invention

The present invention relates to an antistatic coat suitable for coating a surface, in particular, a friction surface of a base body. In addition, the present invention relates to a thermal transfer sheet having an excellent antistatic property on the back surface side thereof, on which a friction is inflicted by a heating member such as a thermal head or the like. Furthermore, the present invention relates to an antistatic agent effectively used for manufacturing the above antistatic coat and the thermal transfer sheet.

2. Description of the Related Art

There have been various problems caused by the accumulation of static electric charges in such various film shaped products and resinous articles as a packaging material for electronic parts, an OHP film, a thermal transfer sheet or the like. There are proposed various methods for preventing the accumulation of static electric charges in the film shaped products. A cationic surface active agent is widely used as an antistatic agent. Although the above method using the cationic surface active agent is convenient and easily applicable method, the durability of the antistatic effect is not sufficient.

A thermal transfer sheet is explained as the principal example of the film shaped products, hereinbelow.

As a thermal transfer sheet, there are known a sublimation type thermal transfer sheet in which a dye layer comprising a sublimation dye and a binder is disposed on one surface of a substrate film such as a polyester film or the like, and a heat fusion type thermal transfer sheet in which an ink layer comprising a wax and a pigment, in place of the above dye layer, is disposed on the substrate film. Such a thermal transfer sheet is image-wise heated from its back surface side by the thermal head to transfer the dye of the dye layer or the ink of the ink layer to the image-receiving material, thus forming an image.

In case that an image is formed by the thermal head with the use of the above thermal transfer sheet, and when the substrate film is made of a thermoplastic resin like a polyester film or the like, a surface electrical resistance of the surface contacted by the thermal head is as high as at least $10^{14}$ ($\Omega$), thus inducing static electricity in the process of forming the image to accumulate electric charges thereon.

When the electric charges are accumulated on the thermal transfer sheet, dusts or the like are attracted to the surface thereof, as a result, the dusts or the like are attached onto the thermal head, thus lowering the resolution of the formed image. In addition, similarly, the electric charges are accumulated on the image-receiving material such as papers, lowering a conveying ability of the image-receiving material. Furthermore, in worse case, there may occur sparks when the thermal transfer roll or the image-receiving material is replaced or inserted. In addition, there may be cases that human bodies are shocked.

As a method to overcome the above problems, there is known a method that an antistatic layer is formed on the back surface of the thermal transfer sheet. However, when the antistatic layer is formed with the use of a surface active agent or the like, there is caused a sticking on the thermal transfer sheet. In addition, there is the following problem when the thermal transfer sheet is rolled, the antistatic agent is transferred to the coloring material layer, or in reverse, the coloring material is transferred to the back surface of the thermal transfer sheet. Furthermore, together with the above problems, there is a further problem that the antistatic effect of the antistatic layer lowers as the time passes.

As another method, there is a method in which a conductive layer is formed with the combined use of a binder and a conductive agent like a conductive carbon black. However, according to the above method, the thermal head severely wears, in addition, when the thermal transfer sheet except a black color one is used, the image-receiving material becomes black as a whole, thus deteriorating appearance thereof, and furthermore, it becomes difficult to detect the detecting mark formed on the thermal transfer sheet.

As further another method, there is proposed a method in which an antistatic layer is formed with the use of an acrylic resin containing a quaternary ammonium salt (refer to Japanese Patent Provisional Publication No. 2-182,491). However, according to the above method, since the quaternary ammonium salt comprises chlorine ion or bromine ion in general, the thermal head is remarkably corroded by such a halogen ion, thus causing another problem.

Furthermore, since the thermal head is heated at a high temperature, the thermal head is stuck to the substrate film, thus deteriorating an excellent mobility of the thermal head to cause breakage and wrinkles in the thermal transfer sheet.

As a method to solve the above problems, there is known a method in which a back surface layer comprising a heat resistance resin is formed on the contact surface to the thermal head. However, it is difficult in the above method to form such a thin film with the use of the heat resistance resin as not to lower a sensitivity thereof. Furthermore, even if such a thin film can be formed, it cannot afford a sufficient slipping ability, and resulting in an insufficient mobility of the thermal head.

On the other hand, there is known a method in which a slip layer is formed on the outermost surface of the back surface with the use of a silicone oil or silicone wax. However, since the silicone oil or silicone wax has a lower film strength, the slip layer thus formed is scraped off by the thermal head, and thus scraped slip layer deposits on the surface of the thermal head as the head grime, resulting in a poor printing.

In addition, it is impossible to form both of the antistatic layer and slip layer at the outermost position of the back surface.

More specifically, when the antistatic layer is formed on the outermost surface of the friction surface such as the contact surface with the thermal head, the remarkably excellent antistatic effect can be obtained. However, on the other hand, the durability of the antistatic effect is insufficient, and, the sticking on the surface of the thermal head and the contamination of the antistatic layer are caused. In addition, the bad influence to the other articles such as the image receiving sheet, the thermal head or the like was inflicted by the antistatic layer, for example, the contamination of the coloring material layer, the wear or corrosion of the thermal head. Furthermore, it is necessary to provide the friction surface of the products with not only antistatic property, but also other functions such as heat resistance and slipping ability. However, when the antistatic layer is formed on the outermost surface of the friction surface, the other functions which is necessary for the friction surface are sacrificed.

SUMMARY OF THE INVENTION

The first object of the present invention is to provide an antistatic coat, in which an excellent antistatic effect can be maintained for a long period of time, and furthermore the sticking on the surface, the contamination of the antistatic layer and the bad influence to the other articles like the thermal head by the antistatic layer can be prevented from occurring.

The second object of the present invention is to provide a thermal transfer sheet excellent in antistatic property, anticorrosion property, heat resistance, coating ability and the slipping ability, which provides excellent mobility to the thermal head, and prevents the wear of the thermal head and the deposition of the grime thereon.

The third object of the present invention is to provide an antistatic agent effectively used for manufacturing the above antistatic coat and thermal transfer sheet.

To attain the above first object, there is provided an antistatic coat of the present invention for coating a surface of a base body so as to prevent accumulation of electric charges in the base body, where the antistatic coat has a multi-layers structure comprising at least one antistatic layer containing an organic or inorganic conductive material, and the antistatic layer is disposed between the base body and an outermost surface layer of the antistatic coat.

The antistatic layer of the antistatic coat of the present invention is not exposed but covered by the outermost surface layer having the other functions such as those of the protective layer or the heat resistant slip layer. According to the antistatic coat of the present invention, therefore, an excellent antistatic effect can be maintained for a long period of time, in addition, the sticking on the surface, the contamination of the antistatic layer and the bad influence to the outside by the antistatic layer can be prevented from occurring.

The antistatic coat of the present invention can be applied so as to coat any kind of base body. In particular, it is suitable to coat the surface of the base body having a property in which electric charges are easily accumulated thereon by the friction. When the friction surface of the article is coated by the antistatic coat of the present invention, the accumulation of electric charges by the friction is effectively prevented. For example, when the surface, such as the back surface of the thermal transfer sheet and the image-receiving surface of the OHP sheet both of which contact with the heating member like the thermal head, or the surface of the packaging material for the electronic parts is coated with the antistatic coat of the present invention, an excellent antistatic effect can be maintained for a long period of time.

In case that the antistatic coat of the present invention has a multi-layers structure comprising at least three layers, a remarkably effective prevention against the accumulation of the electric charges caused by friction can be achieved by disposing the antistatic layer directly below the outermost surface layer.

In order to attain the above second object, there are provided the first thermal transfer sheet and the second thermal transfer sheet of the present invention.

The first thermal transfer sheet comprises a substrate film, a coloring material layer which is disposed on a front surface side of the substrate film, an antistatic layer and a heat resistant slip layer, both of which are disposed on a back surface side of the substrate film, where the antistatic layer contains an organic or inorganic conductive material, and is disposed between the heat resistant slip layer and the substrate film.

More specifically, in the first thermal transfer sheet, the above antistatic coat comprising the antistatic layer and the heat resistant slip layer is formed on the back surface side of the substrate film. According to the first thermal transfer sheet of the present invention, therefore, an excellent antistatic effect can be maintained for a long period of time, in addition, the sticking on the surface, the contamination of the antistatic layer and the bad influence to the outside by the antistatic layer, for example, the contamination of the coloring material layer, the wear or corrosion of the thermal head and the deposition of the grime thereon, can be prevented from occurring.

Furthermore, since the heat resistant slip layer is formed on the outermost surface of the back surface side of the first thermal transfer sheet as described above, the thermal transfer sheet is excellent in heat resistance, slipping ability, film strength of the back surface.

The second thermal transfer sheet, on the other hand, comprises a substrate film, a coloring material layer disposed on the front surface side of the substrate film, and a heat resistant slip layer disposed on the back surface side of the substrate film, and the heat resistant slip layer contains a binder resin and an organic or inorganic conductive material to have a antistatic property.

More specifically, when the heat resistant slip layer of the thermal transfer sheet further contains the conductive material as described above, an excellent antistatic property, heat resistance and slipping ability can be provided on the back surface side of the thermal transfer sheet.

The heat resistant slip layer of the thermal transfer sheet of the present invention is preferably formed with: the reaction product which is obtained through a reaction of thermoplastic resin having hydroxyl group such as polyvinyl butyral with polyisocyanate; or, acryl modified polyvinyl butyral resin. The heat resistant slip layer formed with those resin is remarkably excellent in heat resistance, slipping ability and film strength.

In order to attain the above third object, there are provided the first to third antistatic agents of the present invention. The first antistatic agent contains, as an effective ingredient, a conductive polymer having $\pi$-electron conjugated system, preferably, sulfonated polyaniline. The second antistatic agent contains, as an effective ingredient, a conductive carbon black having a primary particle size of up to 40 nm, and a specific surface of at least 130 $m^2/g$. The third antistatic agent contains as an effective ingredient a conductive carbon black having an oil absorption of at least 75 ml/100 g. It is preferable that the conductive carbon black has a primary particle size of up to 40 nm, and a specific surface of at least 130 $m^2/g$, and the oil absorption of at least 75 ml/100 g.

DETAILED DESCRIPTION OF PREFERRED EMBODIMENTS

Figure 1:
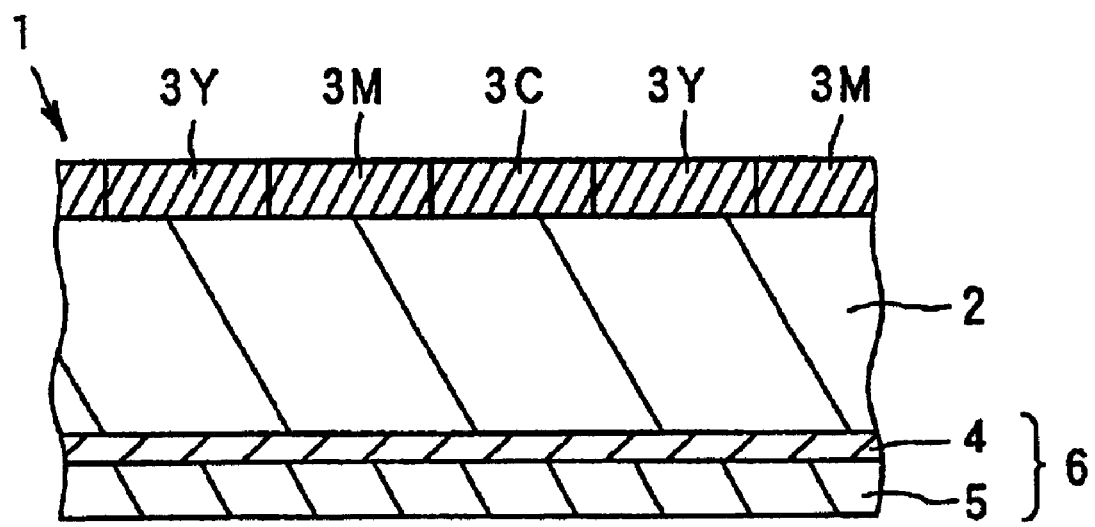
FIG. 1 is a schematic sectional view illustrating a thermal transfer sheet with its back surface side coated with the antistatic coat of the present invention.

FIG. 1 is a schematic sectional view illustrating a thermal transfer sheet 1 with its back surface side coated by the antistatic coat of the present invention. In the thermal transfer sheet 1, each color of the coloring material layer 3, i.e., Yellow 3Y, Magenta 3M and Cyan 3C is arranged in sequence as its order on the front surface side of the substrate film 2 as shown in FIG. 1. On the other hand, the primer layer 4 having an antistatic property is formed on the back surface side of the substrate film 2, and the heat resistant slip layer 5 is formed further on the primer layer 4. The antistatic coat 6 of the thermal transfer sheet 1, therefore, comprises the antistatic layer additionally functioning as the primer layer and the outermost surface layer functioning as both of the heat resistant layer and slip layer, to coat the substrate film as the base body.

As is shown in FIG. 1, the antistatic coat of the present invention principally has a double-layers structure in which the primer layer having the antistatic property is formed on the base body, and the outermost surface layer having other functions such as the protective layer or heat resistant slip layer is further formed through the primer layer on the base body. In this case, since the antistatic layer additionally functions as the primer layer, it is efficient. Furthermore, since the antistatic layer is disposed directly below the outermost surface layer, it is possible to most effectively prevent the accumulation of electric charges caused by friction. In particular, in case of the thermal transfer sheet, since the layer functioning as the antistatic layer and the layer functioning as the heat resistant slip layer are formed respectively, it is possible to form a thin heat resistant slip layer, thus improving the sensitivity of the thermal transfer sheet to the thermal head.

Furthermore, when the thin primer layer contains carbon black, the detecting mark of the thermal transfer sheet is hardly hidden, resulting in a preferable effect.

Any kind of known material having the heat resistance and strength in general scope can be used for the substrate film of the thermal transfer sheet of the present invention. For example, there are listed the following substrate films having a thickness within a range of 0.5 to 50 μm, preferably, 3 to 10 μm: paper, various kinds of converted paper, polyester film, polystyrene film, polypropylene film, polysulfone film, aramid film, polycarbonate film, polyvinyl alcohol film, cellophane, or the like. Among them, the polyester film such as a polyethylene terephthalate film is particularly preferable. The type of the substrate film is not limited specifically, namely, a sheet or leaf shape type film and a continuous film can be used.

The antistatic primer layer formed on one surface of the above substrate film is prepared with the use of a binder having good adhesiveness to both of the substrate film and the heat resistant slip layer, and an organic or inorganic conductive material as an antistatic agent, as essential ingredients thereof.

As the above binder, for example, there are listed as follows: polyester resin, polyurethane resin, polyacrylic resin, polyvinylformal resin, epoxy resin, polyvinyl butyral resin, polyamide resin, polyether resin, polystyrene resin, styrene-acryl copolymer resin or the like. Water soluble or water dispersible polyester resin having a carboxyl group is preferable among the above in the properties of adhesion to the substrate film, compatibility to the organic conductive material, dispersibility of the inorganic conductive material and adhesion to the heat resistant slip layer. The water soluble or water dispersible polyester resin having a carboxyl group has a good compatibility to sulfonated polyaniline as one of the organic conductive material, and in addition, has a property to disperse carbon black as one of the inorganic conductive material. The above polyester resin can be obtained, for example, through the product named as POLYESTER WR-961, manufactured by Nihon Gosei Kagaku Kogyo Co. Ltd.

As the organic conductive material used for the antistatic agent, the conductive polymer having π-electron conjugated system is preferable. More specifically, as those conductive polymer, there are listed as follows: sulfonated polyaniline, chemically doped polyacetylene, poly-para-phenylenevinylene, poly-para-phenylene sulfide, polypyrrole chemically doped and polymerized, polythiophene, polyaniline, the heat-treated product of the phenol resin, the heat-treated product of polyamide, the heat-treated product of peryleneoxylic anhydride or the like.

As the above organic conductive material, sulfonated polyaniline is particularly effective. Various kinds of sulfonated polyaniline are known. There is listed the sulfonated polyaniline having the following structure, as an example:

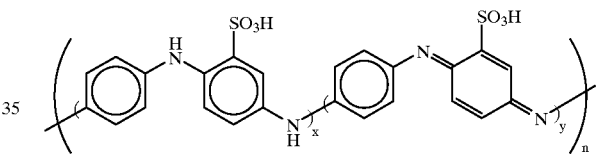

[in the above formula, each of x, y and n is integer setting a molecular weight of the sulfonated polyaniline within a range of about 300 to 10,000]

The above sulfonated polyaniline is soluble in the solvent containing water or alkali water, and forms intramolecular salt or alkali salt to be dissolved therein. Those sulfonated polyaniline can be obtained, for example, through the product named as AQUA-SAVE-01Z manufactured by Nitto Kagaku Kogyo Co., in addition, through the aqueous solution thereof, the aqueous dispersed liquid thereof, the solution or dispersion thereof in the mixed solvent of the water and an organic solvent to be used for the present invention. Those solution or dispersion is usually yellowish, but almost transparent when its concentration is low.

The antistatic layer (i.e., primer layer) is prepared with the use of the above binder and the above organic conductive material as essential ingredient thereof. More specifically, firstly, the above binder and the above organic conductive material are dissolved or dispersed into the solvent containing water, for example, the mixture of water and water soluble organic solvent such as methanol, ethanol, isopropyl alcohol, or normal propyl alcohol to prepare a coating liquid. Then, the thus prepared coating liquid is applied on one surface of the substrate film by the conventionally used coating means such as a gravure coater, a roll coater, MAYER BAR or the like, and then dried to prepare the primer layer.

Such various additives can be added to the coating liquid as the surface active agent to improve wetting of the substrate film upon coating, the defoaming agent to suppress bubbles, or a dispersing agent to disperse the conductive material. In particular, as the surface active agent, the phosphate surface active agent is preferably used.

The coating liquid for the antistatic layer preferably comprises about 2 to 10 wt. %, more preferably, 4 to 4.75 wt. % of binder resin, about 0.1 to 5 wt. %, more preferably, 0.25 to 1 wt. % of organic conductive material (in solid component), about 0 to 2 wt. %, more preferably, 0.2 to 1 wt. % of surface active agent and the balance being solvent. In particular, in case that the antistatic agent comprises sulfonated polyaniline, the composition of the solvent is selected so as for sulfonated polyaniline to exist as particles having particle size of 0.01 to 1.0 μm in the coating liquid for the antistatic layer, thus the most excellent antistatic effect can be obtained.

Figure 2:
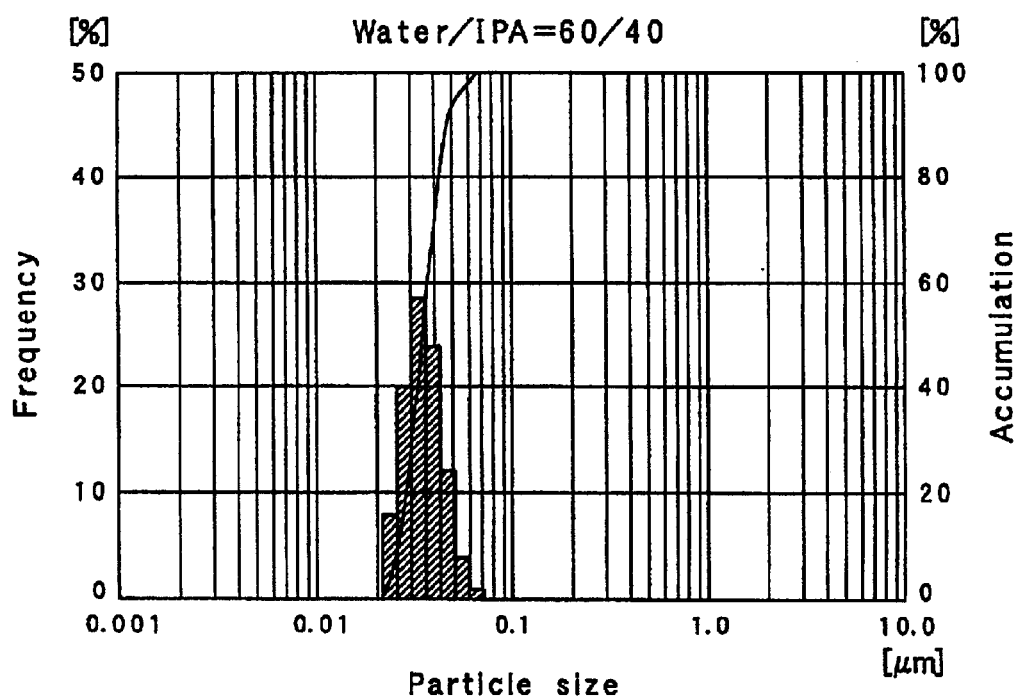
FIGS. 2 to 4 are graphs illustrating particle size distributions of sulfonated polyaniline.
Figure 3:
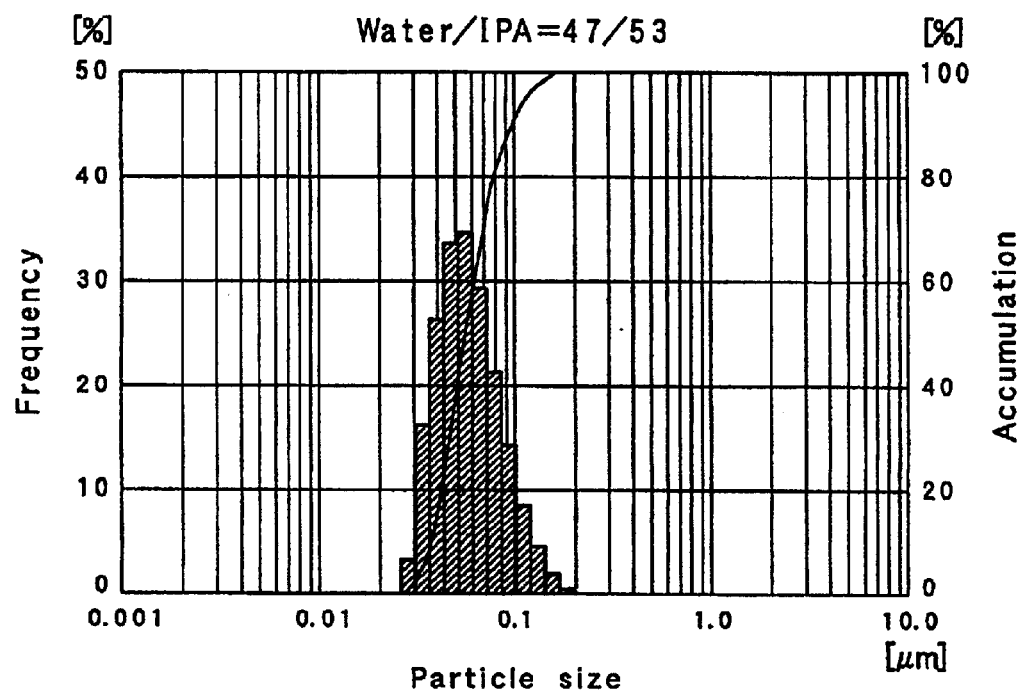
Figure 4:
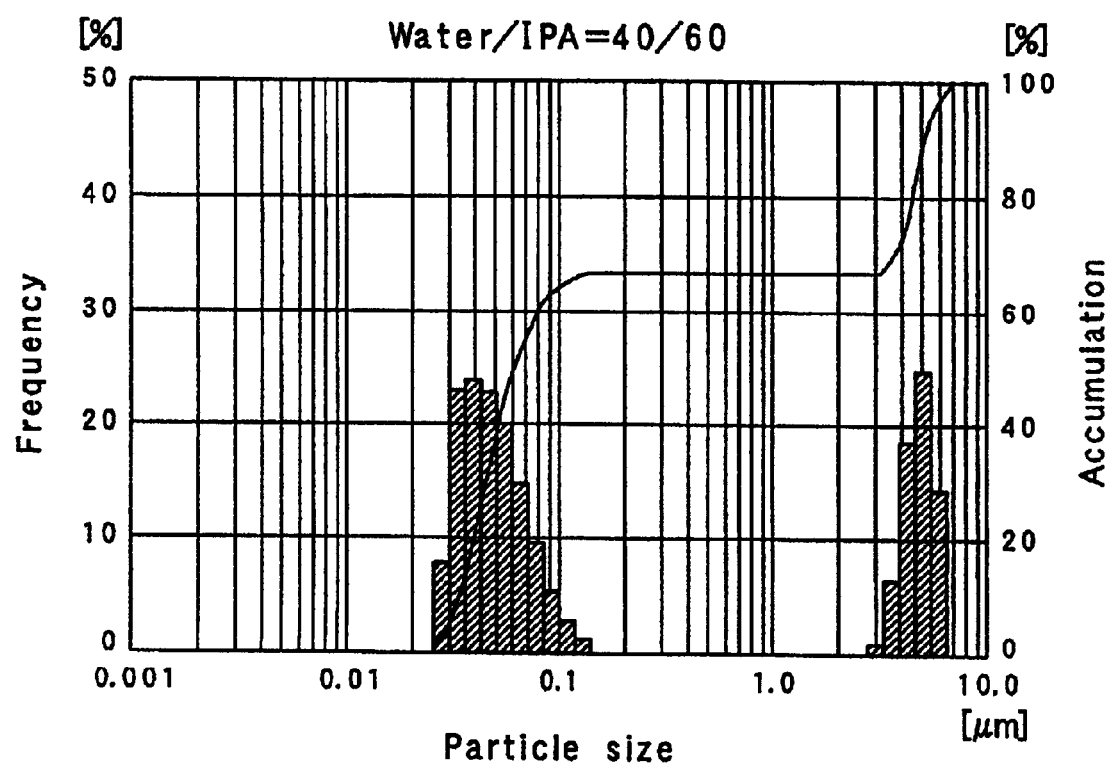

More specifically, sulfonated polyaniline is water soluble but not soluble in the water soluble organic solvent. The sulfonated polyaniline can be therefore dispersed as fine particles in the coating liquid by means of adjusting mixing ratio of water to the water soluble organic solvent upon preparing the coating liquid, and adding appropriate surface active agents as required. FIGS. 2 to 4 show that particle size distributions of the sulfonated polyaniline in the coating liquid varies in accordance with mixing ratio of water to the organic solvent as a liquid medium.

As shown in FIGS. 2 and 3, the coating liquid containing sulfonated polyaniline having particle size distributions within a range of 0.01 to 1.0 μm provides the primer layer having an excellent coating ability as well as antistatic effect. On the contrary, as shown in FIG. 4, although the coating liquid containing sulfonated polyaniline having particle size distributions outside the above scope provides the coating layer having an excellent antistatic effect, the coating condition or coating means have to be appropriately selected in order to obtain an excellent coating ability.

The coating amount in solid component of the coating liquid, in case that the organic conductive material is used, is normally in a range of about 0.02 to 1.0 $g/m^2$ (the thickness thereof is of 0.05 to 0.5 μm when dried), preferably, about 0.07 to 0.2 $g/m^2$. With the coating amount under the above lower limit, it does not sufficiently function as both of the antistatic layer and the primer layer. On the other hand, with the coating amount over the above upper limit, the effect obtained does not improve any more in accordance with the increased thickness, thus economically not efficient, and furthermore, the thermal conductivity from the thermal head to the thermally transferable coloring material layer is lowered, thus not preferable.

As the inorganic conductive material used for the antistatic agent, for example, there are specifically listed as follows: carbon black, lanthanum titanate ($LaTiO_3$), tin oxide ($SnO_2$), zinc oxide (ZnO), indium-zinc oxide ($In_2O_3$—ZnO), antimony-tin oxide ($SbSnO_2$), indium oxide ($In_2O_3$), zinc-tin-indium oxide ($(Zn, Sn)In_2O_3$), alumina-zinc oxide (ZnO—$Al_2O_3$), gallium-zinc oxide (ZnO—$Ga_2O_3$) or the like.

Carbon black is particularly effective as the above inorganic conductive material. Carbon black used for the antistatic agent in the present invention preferably has a primary particle size of up to 40 nm, and a specific surface of at least 130 $m^2/g$, more preferably, a primary particle size of up to 35 nm, and a specific surface of at least 250 $m^2/g$. The oil absorption of the above carbon black is preferably at least 50 ml/100 g, more preferably, at least 75 ml/100 g. Carbon black having above mentioned property is good in dispersibility and excellent in antistatic property.

A term "primary particle size" means a particle size of an individual particle in no aggregated state. In other word, the primary particle size is a minimum unit of the particle size. The carbon black particle normally exists in the aggregated state, and has a larger particle size than its primary particle size.

There can be listed, for example, as the above carbon black as follows: CB 950 manufactured by Mitsubishi Kagaku Co. Ltd. (primary particle size: 16 nm, specific surface: 250 $m^2/g$, oil absorption: 80 ml/100 g); CB 970 manufactured by Mitsubishi Kagaku Co. Ltd. (primary particle size: 16 nm, specific surface: 250 $m^2/g$, oil absorption: 80 ml/100 g); CARBON ECP manufactured by Lion Co. Ltd. (primary particle size: 30 nm, specific surface: 800 $m^2/g$, oil absorption: 360 ml/100 g); CARBON ECP600JD manufactured by Lion Co. Ltd. (primary particle size: 30 nm, specific surface: 1200 $m^2/g$, oil absorption: 490 ml/100 g). Carbon black used in the present invention is not limited to the above, and any other carbon black having the above property can be used.

The coating liquid containing the inorganic conductive material can be prepared, then, coated on the substrate film in the same manner as described in the above case using the organic conductive material.

When carbon black is used, the coating liquid for the primer layer preferably comprises about 1.5 to 7.0 wt. %, more preferably, 2.1 to 4.3 wt. % of binder resin, about 0.4 to 2.0 wt. %, more preferably, 0.6 to 1.5 wt. % of carbon black, about 0 to 1.5 wt. %, more preferably, 0.2 to 1 wt. % of dispersing agent, about 0 to 1.0 wt. % of defoaming agent, and the balance being solvent.

The coating amount in solid component of the coating liquid, in case that the carbon black is used, is normally in the range of about 0.05 to 0.2 $g/m^2$ (the thickness thereof is of 0.05 to 0.2 μm when dried), preferably, about 0.07 to 0.13 $g/m^2$. With the coating amount under the above lower limit, it does not sufficiently function as both of the antistatic layer and the primer layer. On the other hand, with the coating amount over the above upper limit, the hiding by the primer layer becomes so large that the detection of the detecting mark disposed on the thermal transfer sheet becomes difficult, in addition, the effect obtained does not improve any more in accordance with the increased thickness, thus economically not efficient, and furthermore, the thermal conductivity from the thermal head to the thermally transferable coloring material layer is lowered, thus not preferable.

In the present invention, the heat resistant slip layer comprising thermoplastic resin is formed on the surface of the above antistatic primer layer. Followings may be used as the thermoplastic resin: polyester resin, polyacrylate resin, polyvinyl acetate resin, styrene acrylate resin, polyurethane resin, polyolefin resin, polystyrene resin, polyvinyl chloride resin, polyether resin, polyamide resin, polycarbonate resin, polyethylene resin, polypropylene resin, polyacrylate resin, polyacrylamide resin, polyvinylbutyral resin, polyvinyl acetal resin such as polyvinyl acetoacetal resin or the like, or silicone modified product thereof. The preferable resin are the resin having a hydroxyl group reacting with an isocyanate group such as polyvinyl butyral resin, polyvinyl acetal like polyvinyl acetoacetal resin, or silicone modified product thereof.

In the preferred embodiment of the present invention, it is preferable to jointly use polyisocyanate as a cross linking agent in order to further improve the heat resistant slip layer in heat resistance, coating ability and adhesion to the antistatic primer layer. Any kinds of known polyisocyanate generally used for paint, adhesive agent and synthesis of polyurethane can be used.

Those polyisocyanate compound can be available in the market, for example, as products named as TAKENATE (manufactured by Takeda Yakuhin Co. Ltd.), BARNOCK (manufactured by Dainippon Ink Kagaku Kogyo Co. Ltd.), COLONATE (manufactured by Nihon Polyurethane Kogyo Co. Ltd.), DURANATE (manufactured by Asahikasei Kogyo Co. Ltd.), DESMODUR (manufactured by Bayer Co. Ltd.).

An amount of polyisocyanate is within a range of 5 to 200 weight parts to 100 weight parts of the binder resin for the heat resistant slip layer. A ratio of —NCO/—OH is preferably within a range of about 0.8 to 2.0. An excessively small amount of polyisocyanate lowers a density of cross linkage to result in insufficient heat resistance. On the other hand, an excessively large amount of polyisocyanate makes it difficult to control shrinkage of a freshly-coated heat resistant slip layer and causes delay in the hardening time. Furthermore, when a not reacted —NCO group remains in the heat resistant slip layer, the remaining —NCO group reacts with moisture in the air, thus causing defects.

The heat resistant slip layer formed with the use of the above polyisocyanate as a cross linking agent is much more excellent in the properties such as heat resistant than the heat resistant slip layer formed with the use of the conventional thermoplastic resin. However, in the method with the use of the above polyisocyanate, an aging treatment is required so as to obtain the sufficient crosslinking by the polyisocyanate (for example, retained in the oven at the temperature of 60° C. for 5 days), causing such problems that the product plan of the thermal transfer sheet have to be reviewed, and a storage used for the thermal transfer sheet under the aging treatment is necessary. On the other hand, when the heat resistant slip layer is formed with the use of the ionaizing radiation hardenable resin (epoxy acrylate, urethane acrylate, polyester acrylate or the like) which can be hardened by the conventional ultraviolet ray or electron ray, there is the following problem: with a low density of cross linkage in the heat resistant slip layer, the heat resistance deteriorates, and on the other hand, with a high density of cross linkage therein, the formed layer is inferior in flexibility.

The above problems can be overcome by means of forming the heat resistant slip layer with the use of acryl modified polyvinyl butyral resin.

The acryl modified polyvinyl butyral is the resin in which the hydroxyl group remaining in the polyvinyl butyral is used so as to further introduce (metha)acryloyl group in the molecule.

One example of the above resin is depicted by the structural formula as follows:

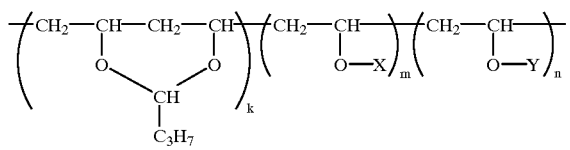

[on the above formula, X denotes a hydrogen atom or an acetyl group, and Y denotes a group having a acryloyl group or a methacryloyl group. The acryloyl group and the methacryloyl group include those bonded to the hydroxyl group of the polyvinyl butyral through the linking group, e.x., aromatic group, aliphatic group, alicyclic group or the bond containing atoms except carbon atom such as urethane bond. In addition, when a total of k, m and n is 100 in the formula, k is integral number of 40 to 85, m is of 0 to 10, and n is of 15 to 50, and it is preferable that the total molecular weight is within a range of about 30,000 to 200,000.

As is described above, when the heat resistant slip layer of the thermal transfer sheet is formed with the use of acryl modified polyvinyl butyral in which the hydroxyl group remaining in the polyvinyl butyral is used so as to further introduce (metha)acryloyl group in the molecule, the aging treatment after forming the layer is not necessary anymore, thus enabling to form the heat resistant slip layer by the ionaizing radiation such as ultraviolet ray and electron ray as a hardening means. In addition, it is possible to form the heat resistant slip layer excellent in both of flexibility and heat resistance even with high cross linking density.

The above acryl modified polyvinyl butyral is prepared as follows: firstly, polyvinyl butyral resin is dissolved in the soluble solvent, for example ketone, Cellosolve, DMSO or the like, then, while stirring thus prepared solution, (metha) acrylic acid having isocyanate group or its derivative is dropped and reacted. Thus, the isocyanate group reacts with the hydroxyl group of polyvinyl butyral to produce urethane bond, and then (metha)acryloyl group can be introduced into the resin through thus produced urethane bond. The amount of (metha)acrylic acid compound having isocyanate group used for preparing the acryl modified polyvinyl butyral is normally within 0.1 to 5 mole, preferably 0.5 to 3 mole of the isocyanate group per 1 mole of the hydroxyl group in a ratio of the hydroxyl group in the polyvinyl butyral resin to the isocyanate group.

Another method for preparing the above acryl modified polyvinyl butyral is as follows: firstly, polyvinyl butyral resin is dissolved in the soluble solvent, for example ketone, Cellosolve, DMSO or the like, then, while stirring thus prepared solution, (metha)acrylic acid chloride or its derivative is dropped and reacted. Thus, the acid chloride group reacts with the hydroxyl group of the polyvinyl butyral to produce a ester bond, and then the remaining group of the acryloyl acid compound can be introduced into the resin through thus produced ester bond. The amount of (metha) acrylic acid chloride or its derivative used for preparing the acryl modified polyvinyl butyral is normally within 0.1 to 5 mole, preferably 0.5 to 3 mole of the acid chloride group per 1 mole of the hydroxyl group in a ratio of the hydroxyl group in the polyvinyl butyral resin to the acid chloride group.

Examples of manufacturing the above acryl modified polyvinyl butyral is shown below.

Manufacturing Example 1

2.5 g of polyvinyl butyral (ETHLEC BX-1, manufactured by Sekisui Kagaku Kogyo Co. Ltd.), 97 g of methyl ethyl ketone and 0.03 g of dibutyl tin dilaurate were put into a flask fixed with a thermometer, a stirring device, a dropping funnel and a cooling tube, then stirred while sustaining the inner temperature of the flask at 50° C.

Then, 1.07 g of methacryloyloxyethyl isocyanate (KAREMZ MOI, manufactured by Showa Denko Co. Ltd.) was dropped into the flask. After dropping, the content in the flask was heat-reacted at the temperature of 50° C. to produce acryl modified polyvinylbutyral-1. The reaction was finished when an amount of isocyanate in a reacting liquid was measured by back titration analysis and as a result, at least 90% of isocyanate was acknowledged to have reacted.

Manufacturing Example 2

By the same manner as performed in Manufacturing Example 1, 2.5 g of polyvinyl butyral (ETHLEC BX-1, manufactured by Sekisui Kagaku Kogyo Co. Ltd.), 97 g of methyl ethyl ketone (MEK) and 0.68 g of triethylamine were put into the reaction vessel, then stirred while sustaining the inner temperature of the vessel at 60° C.

Then, 1.06 g of acrylic acid chloride (manufactured by Tokyo Kasei Co. Ltd.) was dropped into the vessel. After dropping, the content in the vessel was heat-reacted at the temperature of 60° C. After the reaction, the deposited triethylamine hydrochloride was removed by centrifugal separator to produce acryl modified polyvinylbutyral-2.

Manufacturing Example 3

By the same manner as performed in Manufacturing Example 1, 2.5 g of polyvinyl butyral (ETHLEC BX-1, manufactured by Sekisui Kagaku Kogyo Co. Ltd.), 97 g of methyl ethyl ketone (MEK) were put into the reaction vessel, then stirred while maintaining the inner temperature of the vessel at 50° C.

Then, 2.93 g of methacryloyl isocyanate (MM, manufactured by Nihon Paint Co. Ltd.) was dropped into the vessel. After dropping, the content in the vessel was heat-reacted at the temperature of 50° C. to produce acryl modified polyvinylbutyral-3.

Manufacturing Example 4

By the same manner as performed in Manufacturing Example 1, 2.5 g of polyvinyl butyral (FTHLEC BL-SH, manufactured by Sekisui Kagaku Kogyo Co. Ltd.), 97 g of methyl ethyl ketone (MEK) and 0.03 g of dibutyl tin dilaurate were put into the reaction vessel, then stirred while maintaining the inner temperature of the vessel at 50° C. Then, 0.65 g of KAREMZ MOI was dropped into the vessel. After dropping, the content in the vessel was heat-reacted at the temperature of 50° C. to produce acryl modified polyvinylbutyral-4.

In the present invention, upon forming the heat resistant slip layer with the use of the above material, a thermal release agent or a slip agent such as wax, higher fatty acid amide, ester, surface active agent or the like, organic powder such as fluoro resin or the like, or inorganic particle such as silica, clay, talc, calcium carbonate or the like can be contained so as to improve slipping ability of the heat resistant slip layer.

The heat resistant slip layer is prepared as follows: firstly, the above material is dissolved or dispersed into the appropriate solvent such as acetone, methyl ethyl ketone, toluene, xylene or the like to prepare a coating liquid, then, thus prepared coating liquid is applied on the substrate film by the conventionally used coating means such as gravure coater, roll coater, MAYER BAR and dried, and then a cross linking treatment is performed through a heating treatment or ionizing radiation treatment to prepare the heat resistant slip layer.

A coating amount, namely, a thickness of the heat resistant slip layer is important in the present invention. The coating amount for the heat resistant slip layer is normally in the range of up to 2.0 g/m$^2$, preferably 0.1 to 1.0 g/m$^2$ in solid component (the thickness thereof is of 0.1 to 2.0 µm when dried) in order to form the heat resistant slip layer having the sufficient function thereof. With the coating amount under 0.1 g/m$^2$, the heat resistant slip layer does not sufficiently function. On the other hand, with the coating amount over 2.0 g/m$^2$, the antistatic effect of the antistatic layer formed therebelow is lowered, thus not favorable.

The coloring material layer formed on one surface of the above substrate film comprises a layer containing sublimation dye in relation to a sublimation type thermal transfer sheet, and on the other hand, comprises a wax ink layer colored by pigment in relation to a heat fusion type thermal transfer sheet. A sublimation type thermal transfer sheet is explained hereunder as an example, however, the present invention is not limited to the sublimation type thermal transfer sheet.

A dye used for a dye layer is not specifically limited. A conventional dye used for the thermal transfer sheet is effectively useful. For example, there are listed as favorable dye as follows: MS Red G, Macrolex Red Violet R, Ceres Red 7B, Samaron Red HBSL, Resolin Red F3BS or the like for a red dye; Phorone Brilliant Yellow-6GL, PTY-52, Macrolex Yellow-6G or the like for a yellow dye; and Kayaset Blue-714, Waxoline Blue-AP-FW, Phorone Brilliant Blue-S-R, MS Blue-100 or the like for a blue dye.

There are listed as favorable binder resin to carry the above dye as follows: cellulose resin such as ethyl cellulose, hydroxyethyl cellulose, ethylhydroxy cellulose, hydroxypropyl cellulose, methyl cellulose, cellulose acetate, cellulose acetate butyrate or the like; vinyl resin such as polyvinyl alcohol, polyvinyl acetate, polyvinyl butyral, polyvinyl acetal, polyvinyl pyrrolidone or the like; acrylic resin such as poly(metha)acrylate, poly(metha)acrylamide; polyurethane resin; polyamide resin; polyester resin or the like. Among them, cellulose resin, vinyl resin, acrylic resin, polyurethane resin and polyester resin are preferable in heat resistance and transferring ability of the dye.

The dye layer is prepared as follows: firstly, the above dye and binder added with additive agent, for example, release agent as required, is dissolved into an appropriate organic solvent or dispersed into an appropriate organic solvent or water to prepare a solution or a dispersion, then, thus prepared solution or dispersion is applied on one surface of the above substrate film by the conventionally used forming means such as gravure printing, screen printing, reverse roll coating using the gravure plate, and then dried to prepare the dye layer.

A thickness of thus formed dye layer is normally within a range of about 0.2 to 5.0 µm, preferably 0.4 to 2.0 µm. In addition, an amount of the sublimation dye in the dye layer is normally within a range of about 5 to 90 wt. %, preferably 10 to 70 wt. % to the weight of the dye layer.

In case that the desired image comprises a monocolor image, one of the color is selected in the above dye to form the dye layer. In case that the desired image comprises a full-colors image, an appropriate Cyan, Magenta and Yellow (furthermore, black as required), for example, are selected to form the dye layer comprising Yellow, Magenta and Cyan (furthermore, black as required).

Any kinds of sheet can be used as an image receiving sheet used for forming an image with the use of the above thermal transfer sheet, as far as its recording surface has receptiveness to the above dye. When papers, metals, glasses, synthetic resin having no such receptiveness are used, it is necessary to form the dye receptor layer on at least one surface of the above sheet. In the heat fusion type thermal transfer sheet, materials for an image-receiving material are not specifically limited. For example, conventional papers or plastic films can be used for the image-receiving material. In either image receiving sheet, when an antistatic property is required, the antistatic coat of the present invention can be applied to the image receiving sheet.

As the printer used for performing the thermal transfer with the use of the above thermal transfer sheet and the above image receiving sheet, known thermal transfer printers can be used, thus not limited to any specific printer.

The present invention has been explained in relation to the embodiment that the heat resistant slip layer is formed on the substrate film through the antistatic primer layer. In case that an adhesiveness improving treatment is applied to the substrate film, or an adhesiveness of the heat resistant slip layer to the substrate film is excellent, it is possible to provide the heat resistant slip layer with antistatic property by means of adding a conductive material as antistatic agent to the heat resistant slip layer in the same manner as added in the antistatic layer.

On the front surface side of the thermal transfer sheet, together with the coloring material layer of each color, a detecting mark is often provided in order that the printer identifies positions or kinds of the coloring material layer. When the antistatic layer disposed beneath the heat resistant slip layer or the heat resistant slip layer itself contains carbon black, the black layer containing the carbon black hides the detecting mark to likely cause detecting errors.

The above problem can be overcome by such means that the antistatic layer or the heat resistant slip layer containing carbon black is patterned to the shape so as not to hide the detecting mark.

Figure 5:
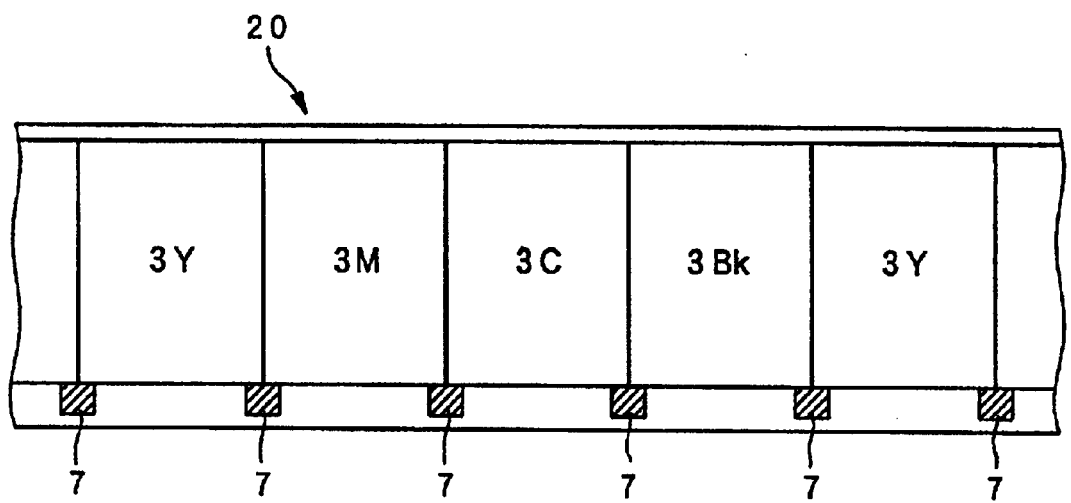
FIG. 5 is a plan view of the thermal transfer sheet having the antistatic primer layer patterned in such a shape as not to hide the detecting mark.
Figure 6:
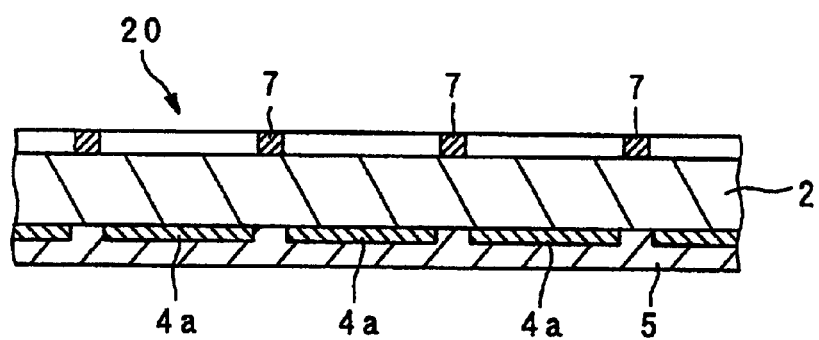
FIG. 6 is a schematic sectional view illustrating the thermal transfer sheet having the antistatic primer layer patterned in such a shape as not to hide the detecting mark.
Figure 7:
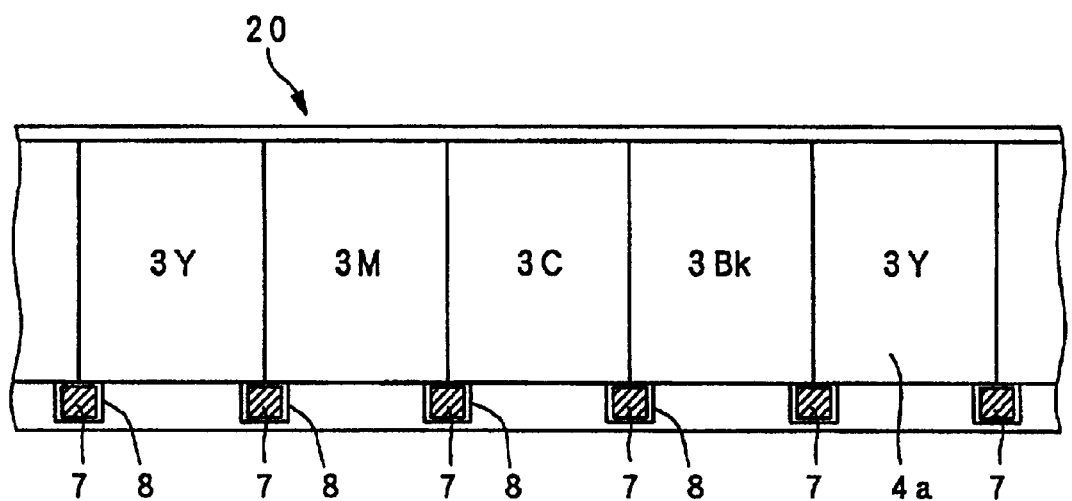
FIG. 7 is a descriptive view illustrating the alignment of the detecting mark and the antistatic primer layer not to hide the detecting mark.

FIGS. 5 to 7 are descriptive view explaining the thermal transfer sheet 20 having the antistatic primer layer patterned to such a shape as not to hide the detecting mark. FIG. 5 is a plan view of the thermal transfer sheet 20. Each color of the coloring material layer, i.e., Yellow 3Y, Magenta 3M, Cyan 3C and Black 3Bk is arranged in sequence and in order on the front surface side of the thermal transfer sheet 20, and in addition, the detecting mark 7 is arranged adjacent in a lateral direction to the coloring material layer. The detecting mark 7 is used in such manner that the printer can detect a color phase and order of each coloring material layer upon forming an image with the use of the thermal transfer sheet 20.

FIG. 6 is a schematic sectional view of the thermal transfer sheet 20. As shown in FIG. 6, a primer layer 4a containing a conductive carbon black is formed on the back surface side of the substrate film 2 of the thermal transfer sheet 20, and the heat resistant slip layer 5 is further formed through the primer layer 4a on the back surface side of the substrate film 2. The primer layer 4a is formed in such a shape as not to hide the detecting mark 7 when the thermal transfer sheet 20 is seen from the back surface side.

FIG. 7 is a descriptive view explaining the region where the primer layer 4a containing carbon black is formed. It is clearly shown in FIG. 7 that the primer layer 4a has a shape not to hide the detecting mark 7. There is remained a space 8 along the border between the detecting mark 7 and the primer layer 4a. However, the space 8 is not essential. As far as the printer can detect the detecting mark, the edge of the detecting mark 7 may be overlapped by the edge of the primer layer 4a enclosing the detecting mark.

The antistatic coat of the present invention can be applied to the recording sheet for the overhead projector (OHP). As for the OHP, the above antistatic layer (transparent or semi-transparent conductive material should be used) is formed on at least one surface of the substrate film, and the image-receiving layer is formed thereon. Conventional substrate film can be used as it is. The antistatic layer is formed in the same manner as described above. The image-receiving layer is formed in such a manner as suitable for forming process of the image. For example, when the image forming means comprises an electrophotography type, the material suitable to the fixing of the toner image used in the electrophotography, is selected. When the image forming means comprises a sublimation type thermal transfer, the material excellent in dye receiving property is selected. When the image forming means comprises a heat fusion type thermal transfer, the material excellent in adhesiveness to an ink layer is selected. When the image forming means comprises an ink-jet type, the material excellent in receptiveness to water base ink is selected. Materials for the receptor layer and the layer-forming process in the above image forming processes are not specifically limited, and the conventional material and process can be used.

The antistatic coat of the present invention may be applied to the packaging material for electronic parts in which the accumulation of electric charges should be shut out. There are known various kinds of packaging material for electronic parts. When the antistatic coat of the present invention is applied to the packaging material for electronic parts, the above-mentioned antistatic layer is to be formed on at least one surface of the substrate sheet or film of the known packaging material for electronic parts, and then, an appropriate outermost layer such as a protective layer or a heat seal layer is to be formed thereon. In this case, the materials should not be the transparent or semi-transparent conductive material. The forming process for the antistatic coat is as described above. The material for outermost layer and layer-forming process thereof is not specifically limited, and conventional material and process may be used.

Furthermore, the antistatic coat of the present invention may be applied to the plastic sheet product or resin formed product for which antistatic property is required. When the antistatic coat of the present invention is applied to the plastic sheet product or resin formed product, the above-mentioned antistatic layer (transparent or semi-transparent organic conductive material should be used) is to be formed on the surface of the plastic sheet product or resin formed product, and then, an appropriate outermost layer such as a hard protect coat or another function layer is to be formed thereon. For example, a flexible disk (i.e., floppy disk) or optical card is listed. As for the flexible disk, the antistatic layer of the present invention is to be formed on the substrate film, and the magnetic layer is to be formed thereon. As for the optical card, the antistatic layer of the present invention is to be formed between an optical record layer and a transparent protect layer.

Furthermore, the antistatic coat of the present invention may be applied to the anti-reflective film for which antistatic property is required. There are known various kinds of material for the anti-reflective film. When the antistatic coat of the present invention is applied to the anti-reflective film, the above-mentioned antistatic layer (transparent or semi-transparent organic conductive material should be used) is to be formed on at least one surface of the substrate sheet or film of the known anti-reflective film, and then, an appropriate outermost layer such as a protective layer or another optically functioning layer is to be formed thereon.

In general, the anti-reflective film comprising the substrate, a high index of refraction layer formed on the substrate, and a low index of refraction layer formed on the high index of refraction layer, is used. The antistatic layer of the present invention may be formed as the high index of refraction layer under the low index of refraction layer. Another structure in which the high index of refraction layer is further formed under the antistatic layer of the present invention may be used. In addition, the antistatic layer of the present invention may be formed as the low index of refraction layer, and a further higher index of refraction material may be used for the high index of refraction layer. In this case, a protective layer is further to be formed on the surface thereof The forming process of the antistatic coat is as described above. The material for another layers and a layer-forming process thereof is not specifically limited, and conventional material and process may be used.

As described above, according to the present invention, an antistatic coat having an excellent antistatic effect for a long period of time can be obtained. According to the antistatic coat of the present invention, various problems such as the contamination of the antistatic layer, the outward transfer of the antistatic agent in the antistatic layer, or the problem caused by the exposure of the antistatic layer can be effectively prevented.

The antistatic coat of the present invention is coated on surfaces of various products to prevent the accumulation of electric charges, and particularly effective for coating the friction surface of the products. For example, the back surface of the thermal transfer sheet or the image receiving surface of the OHP sheet contacts with heating elements such as a thermal head, and the surface of the packaging material for electronic parts is rubbed upon packaging. The accumulation of electric charges by those friction can be effectively prevented by such means that the frictional surface is coated with the antistatic coat of the present invention.

According to the thermal transfer sheet of the present invention, an excellent antistatic effect can be maintained for a long period of time, and the sticking on the back surface, the contamination of the antistatic layer and the bad influence to the other articles, for example, the contamination of the coloring material layer, wear or corrosion of the thermal head can be effectively prevented from occurring. Furthermore, the thermal transfer sheet of the present invention is excellent in heat resistance, slipping ability and film strength of the back surface, since the outermost surface layer having a heat resistant property and a slipping property is formed on the back surface side thereof.

Sulfonated polyaniline as one of the organic conductive material does not have a temperature dependency in its antistatic property, and with a small amount thereof a sufficient antistatic property can be obtained, thus favorable. Furthermore, since sulfonated polyaniline has a high transparency, the antistatic coat has a good appearance, and does not hide the detecting mark. In addition, different from carbon black, when sulfonated polyaniline is contained in the heat resistant slip layer, it does not wear the thermal head.

On the other hand, carbon black as one of the inorganic conductive material does not have a temperature dependency in its antistatic property, and with a small amount thereof a sufficient antistatic property can be obtained, thus favorable. Although carbon black has a defect of poor transparency to give the antistatic coat a poor appearance, it is possible to prevent detecting errors by such means that the antistatic layer is patterned to such a shape as not to hide detecting mark.

The present invention is explained further in detail with reference to experimental examples and comparative examples.

EXAMPLE of SERIES A

Example A-1

The following ink for a primer layer was applied on the front surface of the PET substrate sheet (a thickness of 6 $\mu$m, manufactured by Diafoil Co. Ltd.) by means of MAYER BAR #5 so as for the thickness thereof to be 0.1 $\mu$m when dried (a coating amount of 0.1 g/m$^2$), then dried by a warm air to form an antistatic primer layer:

| <Ink for Primer Layer> | |
| --- | --- |
| Sulfonated polyaniline (manufactured by Nitto Kagaku Kogyo Co. Ltd., 10 wt. % in solid component) | 0.25 weight parts (in solid component) |
| Water soluble polyester resin (POLYESTER-WR-961, manufactured by Nihon Gosei Kagaku Kogyo Co. Ltd., 30 wt. % in solid component) | 4.75 weight parts (in solid component) |
| Phosphoric ester surface active agent (PLYSURF 217E, manufactured by Daiichi Kogyo Seiyaku Co. Ltd.) | 0.2 weight parts |
| Water | 44.8 weight parts |
| Isopropyl alcohol | 50.0 weight parts |

Then, the following ink for a heat resistant slip layer was applied on the surface of the above antistatic primer layer so as for the thickness thereof to be 1.0 $\mu$m when dried, then dried by a warm air, then subjected to a hardening treatment by heating in the oven at the temperature of 60° C. for 5 days to form a heat resistant slip layer:

| <Ink for Heat Resistant Slip Layer> | |
| --- | --- |
| Polyvinyl butyral resin (BX-1, manufactured by Sekisui Kagaku Co. Ltd.) | 80 weight parts |
| Polyisocyanate hardening agent (NCO/OH = 1.8) (TAKENATE D218, manufactured by Takeda Yakuhin Kogyo Co. Ltd.) | 35 weight parts |
| Phosphoric ester (PLYSURF A-2085, manufactured by Daiichi Kogyo Seiyaku Co. Ltd.) | 5 weight parts |
| Solvent (MEK/toluene = 1/1) | 500 weight parts |

Then, the following ink for a dye layer was coated by means of the gravure printing on the back surface of the PET substrate sheet so as for the thickness thereof to be 1.0 g/m$^2$ when dried, then dried to prepare the thermal transfer sheet of the present invention:

| <Ink for Dye Layer> | |
| --- | --- |
| C.I. SOLVENT BLUE-22 | 5.50 weight parts |
| Acetoacetal resin | 3.00 weight parts |
| Methyl ethyl ketone | 22.54 weight parts |
| Toluene | 68.18 weight parts |

Example A-2

With the use of the following ink for a primer layer and ink for a heat resistant slip layer, the thermal transfer sheet of the present invention was prepared by the same manner as described in Example A-1 (a thickness of the antistatic primer layer was 0.1 μm; a thickness of the heat resistant slip layer was 1.0 μm):

| <Ink for Primer Layer> | |
| --- | --- |
| Sulfonated polyaniline (manufactured by Nitto Kagaku Kogyo Co. Ltd., 10 wt. % in solid component) | 0.5 weight parts (in solid component) |
| Water soluble polyester resin (POLYESTER-WR-961, manufactured by Nihon Gosei Kagaku Kogyo Co. Ltd., 30 wt. % in solid component) | 4.5 weight parts (in solid component) |
| Phosphoric ester surface active agent (PLYSURF 212C, manufactured by Daiichi Kogyo Seiyaku Co. Ltd.) | 1.0 weight parts |
| Water | 44.0 weight parts |
| Isopropyl alcohol | 50.0 weight parts |
| <Ink for Heat Resistant Slip Layer> | |
| Polyvinyl butyral resin (BX-1, manufactured by Sekisui Kagaku Co. Ltd.) | 80 weight parts |
| Polyisocyanate hardening agent (NCO/OH = 1.8) (BARNOCK D750, manufactured by Dainippon Ink Kagaku Kogyo Co. Ltd.) | 35 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Example A-3

With the use of the following ink for a primer layer and ink for a heat resistant slip layer, the thermal transfer sheet of the present invention was prepared by the same manner as described in Example A-1 (a thickness of the antistatic primer layer was 0.2 μm; a thickness of the heat resistant slip layer was 1.5 μm):

| <Ink for Primer Layer> | |
| --- | --- |
| Sulfonated polyaniline (manufactured by Nitto Kagaku Kogyo Co. Ltd., 10 wt. % in solid component) | 1.0 weight parts (in solid component) |
| Water soluble polyester resin (POLYESTER-WR-961, manufactured by Nihon Gosei Kagaku Kogyo Co. Ltd., 30 wt. % in solid component) | 4.0 weight parts (in solid component) |
| Phosphoric ester surface active agent (PLYSURF 212C, manufactured by Daiichi Kogyo Seiyaku Co. Ltd.) | 1.0 weight parts |
| Water | 44.0 weight parts |
| Isopropyl alcohol | 50.0 weight parts. |
| <Ink for Heat Resistant Slip layer> | |
| Polyvinyl butyral resin (BX-1, manufactured by Sekisui Kagaku Co. Ltd.) | 80 weight parts |
| Polyisocyanate hardening agent (NCO/OH = 1.8) (BARNOCK D750, manufactured by Dainippon Ink Kagaku Kogyo Co. Ltd.) | 35 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Example A-4

With the use of the following ink for a primer layer and ink for a heat resistant slip layer, the thermal transfer sheet of the present invention was prepared by the same manner as described in Example A-1 (a thickness of the antistatic primer layer was 0.5 μm; a thickness of the heat resistant slip layer was 0.5 μm):

<Ink for Primer Layer> the same as in Example A-i.

<Ink for Heat Resistant Slip Layer>

| | |
|---|---|
| Polyvinyl butyral resin (BX-1, manufactured by Sekisui Kagaku Co. Ltd.) | 80 weight parts |
| Polyisocyanate hardening agent (NCO/OH = 1.8) (BARNOCK D750, manufactured by Dainippon Ink Kagaku Kogyo Co. Ltd.) | 35 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Example A-5

With the use of the following ink for a primer layer and ink for a heat resistant slip layer, the thermal transfer sheet of the present invention was prepared by the same manner as described in Example A-1 (a thickness of the antistatic primer layer was 0.3 µm; a thickness of the heat resistant slip layer was 1.5 µm):

<Ink for Primer Layer>

| | |
|---|---|
| Sulfonated polyaniline (manufactured by Nitto Kagaku Kogyo Co. Ltd., 10 wt. % in solid component) | 1.0 weight parts (in solid component) |
| Water soluble acrylic resin (manufactured by Nitto Kagaku Kogyo Co. Ltd., 10 wt. % in solid component) | 4.0 weight parts (in solid component) |
| Phosphoric ester surface active agent (PLYSURF 212C, manufactured by Daiichi Kogyo Seiyaku Co. Ltd.) | 1.0 weight parts (in solid component) |
| Water | 44.0 weight parts |
| Isopropyl alcohol | 50.0 weight parts. |

<Ink for Heat Resistant Slip Layer>

| | |
|---|---|
| Polyvinyl butyral resin (BX-1, manufactured by Sekisui Kagaku Co. Ltd.) | 80 weight parts |
| Polyisocyanate hardening agent (NCO/OH = 1.8) (BARNOCK D750, manufactured by Dainippon Ink Kagaku Kogyo Co. Ltd.) | 35 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Example A-6

The thermal transfer sheet of the present invention was prepared by the same manner as described in Example A-1, except that the following ink was used instead of the ink for a heat resistant slip layer in Example A-1, and thus formed layer was irradiated to 5 Mrad of the electron ray at 180 KV of an accelerating voltage under the nitrogen gas atmosphere:

<Ink for Heat Resistant Slip Layer>

| | |
|---|---|
| Acryl modified polyvinyl butyral resin as shown in the above Manufacturing Example 1 | 50 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Example A-7

The thermal transfer sheet of the present invention was prepared by the same manner as described in Example A-2, except that the following ink was used instead of the ink for a heat resistant slip layer in Example A-2, and thus formed layer was irradiated to 5 Mrad of the electron ray at 180 KV of an accelerating voltage under the nitrogen gas atmosphere:

<Ink for Heat Resistant Slip Layer>

| | |
|---|---|
| Acryl modified polyvinyl butyral resin as shown in the above Manufacturing Example 2 | 50 weight parts |
| Phosphoric ester (PLYSURF A-208S, manufactured by Daiichi Kogyo Seiyaku Co. Ltd.) | 5 weight parts |
| Solvent (MEK/toluene = 4/1) | 500 weight parts. |

Example A-8

The thermal transfer sheet of the present invention was prepared by the same manner as described in Example A-3, except that the following ink was used instead of the ink for a heat resistant slip layer in Example A-3, and thus formed layer was irradiated to 5 Mrad of the electron ray at 180 KV of an accelerating voltage under the nitrogen gas atmosphere:

<Ink for Heat Resistant Slip Layer>

| | |
|---|---|
| Acryl modified polyvinyl butyral resin as shown in the above Manufacturing Example 3 | 50 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Example A-9

The thermal transfer sheet of the present invention was prepared by the same manner as described in Example A-4, except that the following ink was used instead of the ink for a heat resistant slip layer in Example A-4, and thus formed layer was irradiated to 5 Mrad of the electron ray at 180 KV of an accelerating voltage under the nitrogen gas atmosphere:

<Ink for Heat Resistant Slip Layer>

| | |
|---|---|
| Acryl modified polyvinyl butyral resin as shown in the above Manufacturing Example 4 | 50 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Example A-10

The thermal transfer sheet of the present invention was prepared by the same manner as described in Example A-5, except that the following ink was used instead of the ink for a heat resistant slip layer in Example A-5, and thus formed layer was irradiated to 5 Mrad of the electron ray at 180 KV of an accelerating voltage under the nitrogen gas atmosphere:

<Ink for Heat Resistant Slip Layer>

| | |
|---|---|
| Acryl modified polyvinyl butyral resin as shown in the above Manufacturing Example 1 | 50 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Comparative Example A-1

The thermal transfer sheet for comparison was prepared by the same manner as described in Example A-2, except that the sulfonated polyaniline was not used (a thickness of the heat resistant slip layer was 1.0 μm).

Comparative Example A-2

The thermal transfer sheet for comparison was prepared by the same manner as described in Example A-1, except that the following ink for the primer layer and ink for the heat resistant slip layer was used instead of the inks used in Example A-1 (a thickness of the antistatic primer layer was 0.5 μm, and a thickness of the heat resistant slip layer was 1.0 μm):

| <Ink for Primer Layer> | |
|---|---|
| Acrylic resin (30% solution of BR-85, manufactured by Mitsubishi Rayon Co. Ltd.) | 100 weight parts |
| Antistatic agent (a quaternary ammonium surface active agent (TB-34), manufactured by Matsumoto Yushi Co. Ltd.) | 5 weight parts |
| Solvent (MEK/toluene = 1/1) | 500 weight parts. |
| <Ink for Heat Resistant Slip Layer> | |
| Polyvinyl butyral resin (BX-1, manufactured by Sekisui Kagaku Co. Ltd.) | 80 weight parts |
| Polyisocyanate hardening agent (NCO/OH = 1.8) (BARNOCK D750, manufactured by Dainippon Ink Kagaku Kogyo Co. Ltd.) | 35 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Each of the above-mentioned thermal transfer sheets of the present invention and for comparison was placed on the conventionally used thermal image-receiving sheet, an then thus prepared sheets are thermally transferred by means of the thermal transfer recording apparatus under the following conditions to investigate the occurrence of the sticking between the thermal head and the thermal transfer sheet, the occurrence of wrinkles, the transferring of the dye (60° C., 17 g/m$^2$, 3 days), surface resistant ratio ($\Omega$/cm$^2$, 500 V impressed, 25.5° C., 62% RH), adhesiveness and half life. The results are shown in Table 1.

| <Transfer Conditions> | |
|---|---|
| Pulse width | 1 ms |
| Recording cycle | 2.0 ms/line |
| Recording Energy | 3.0 J/cm$^2$. |

<Evaluation Methods>
(1) Occurrence of Sticking and Wrinkles: Observed with Eye
(2) Transferring of Dye The dye layer was placed face to face on the heat resistant slip layer, then the pressure of 200 g/cm$^2$ was applied thereto, then after holding same at the temperature of 60° C. for 24 hours, investigated the transferring of the dye to the heat resistant slip layer and evaluated as follows:

○: no transferring,
Δ: a little transferring was identified,
×: remarkably transferring.

(3) Surface Resistant Ratio

With the use of the resistant ratio measurement for a high resistance (Hiresta IP, manufactured by Mitsubishi Yuka Co. Ltd.), surface resistance per 1 cm$^2$ were investigated under the conditions of 24° C., 68% RH, and the results thereof are shown, (4) Adhesiveness A mending tape (manufactured by Sumitomo 3M, a width of 18 mm) was stuck on the surface of the heat resistant slip layer, and then took the mending tape off the heat resistant slip layer at once, then investigated the state of peeling off in the heat resistant slip layer and the antistatic primer layer and evaluated as follows:

○: no peeling off,
Δ: partially peeled off.

(5) Half life

With the use of the Static electricity damping measure Model 406D (manufactured by American EST Co. Ltd.), the voltage of 5 kv was impressed on the heat resistant slip layer, and stopped impressing the voltage, then investigated the time until the voltage in the heat resistant slip layer decreased to 2.5 kv, and then evaluated as follows: up to 0.1 second for excellent antistatic property, wherein ∞ shows that the voltage does not decrease below 5 kv.

TABLE I

| | Occurrence of Sticking and Wrinkles | Transferring of Dye | Surface Electrical Resistance ($\Omega$/cm$^2$) | Adhesiveness | 24° C., 40% RH | 24° C., 16% RH |
|---|---|---|---|---|---|---|
| Example A-1 | NONE | ○ | 1 × 10$^{10}$ | ○ | 0.01 | 0.02 |
| Example A-2 | NONE | ○ | 1 × 10$^9$ | ○ | 0.01 | 0.01 |
| Example A-3 | NONE | ○ | 2 × 10$^9$ | Δ~○ | 0.01 | 0.01 |
| Example A-4 | NONE | ○ | 6 × 10$^8$ | ○ | 0.01 | 0.01 |
| Example A-5 | NONE | ○ | 5 × 10$^9$ | ○ | 0.01 | 0.01 |
| Example A-6 | NONE | ○ | 5 × 10$^9$ | ○ | 0.01 | 0.01 |
| Example A-7 | NONE | ○ | 5 × 10$^9$ | ○ | 0.01 | 0.01 |

TABLE I-continued

| | Occurrence of Sticking and Wrinkles | Transferring of Dye | Surface Electrical Resistance ($\Omega/cm^2$) | Adhesiveness | 24° C., 40% RH | 24° C., 16% RH |
|---|---|---|---|---|---|---|
| Example A-8 | NONE | ○ | $5 \times 10^9$ | ○ | 0.01 | 0.01 |
| Example A-9 | NONE | ○ | $5 \times 10^9$ | ○ | 0.01 | 0.01 |
| Example A-10 | NONE | ○ | $5 \times 10^9$ | ○ | 0.01 | 0.01 |
| Comparative Example A-1 | NONE | ○ | at least $1 \times 10^{13}$ | ○ | ∞ | ∞ |
| Comparative Example A-2 | Sticking and Wrinkle occurred | X | at least $1 \times 10^{13}$ | X~Δ | ∞ | ∞ |

Example A-11

Figure 8:
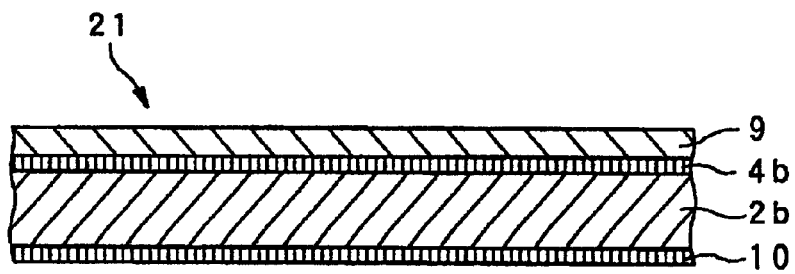
FIG. 8 is a schematic sectional view illustrating the OHP image-receiving sheet prepared in the Example A-11.

The image receiving sheet 21 for an OHP used for the electrophotographic type, having the sectional structure shown in FIG. 8 was prepared. In the image receiving sheet 21 for the OHP, the receptor layer 9 was formed through the antistatic layer 4b on the front surface side of the substrate film 2b, and the antistatic back surface layer 10 was formed on the back surface side of the substrate film 2b.

Firstly, a polyethylene terephthalate film having a thickness of 75 μm was prepared, then the coating liquid 1a for antistatic layer having the following composition was applied on the front surface of the above polyethylene terephthalate film, then dried to form the antistatic layer, and then the coating liquid 1 for the receptor layer having the following composition was applied further on the antistatic layer, then dried to form the receptor layer.

Then, the coating liquid 1b for antistatic layer was applied on the back surface of the polyethylene terephthalate film, then dried to form the antistatic back surface layer, thus obtained the OHP sheet. The thickness of the receptor layer was 3 μm when dried, the thickness of the respective antistatic layer and antistatic back surface layer was 0.3 μm when dried.

| <Coating Liquid 1 for Receptor Layer> | |
|---|---|
| Polyester resin (the polymer of fumaric acid and polypropylene glycol modified bisphenol A; a glass transition temperature of 60° C.; a softening point of 100° C.) | 30 weight parts |
| Silica fine particle (average particle size of 5 μm) | 0.15 weight parts |
| Methyl ethyl ketone | 35 weight parts |
| Toluene | 35 weight parts. |
| <Coating Liquid 1a for Antistatic Layer> | |
| Sulfonated polyaniline (SAVE-01Z, manufactured by Nitto Kagaku Kogyo Co. Ltd., 10 wt. % in solid component) | 0.46 weight parts (in solid component) |
| Water soluble polyester resin (POLYESTER-WR-961, manufactured by Nihon Gosei Kagaku Kogyo Co. Ltd., 30 wt. % in solid component) | 2.4 weight parts (in solid component) |
| Phosphoric ester surface active agent (PLYSURF 217E, manufactured by Daiichi Kogyo Seiyaku Co. Ltd.) | 0.01 weight parts |
| Water | 36.53 weight parts |
| Isopropyl alcohol | 60.60 weight parts. |
| <Coating Liquid 1b for Antistatic Layer> | |
| Sulfonated polyaniline (SAVE-01Z, manufactured by Nitto Kagaku Kogyo Co. Ltd., 10 wt. % in solid component) | 0.76 weight parts (in solid component) |
| Water soluble polyester resin (POLYESTER-WR-961, manufactured by Nihon Gosei Kagaku Kogyo Co. Ltd., 30 wt. % in solid component) | 2.42 weight parts (in solid component) |
| Phosphoric ester surface active agent (PLYSURF 217E, manufactured by Daiichi Kogyo Seiyaku Co. Ltd.) | 0.02 weight parts |
| Water | 36.30 weight parts |
| Isopropyl alcohol | 60.50 weight parts. |

Comparative Example A-3

The image receiving sheet for comparison was prepared by the same manner as described in Example A-11, except that the following coating liquid 2a, 2b for the antistatic layer was used instead of the coating liquid 1a, 1b for the antistatic layer used in Example A-11 (a thickness of the respective antistatic layer was 0.01 μm):

| <Coating Liquid 2a for Antistatic Layer> | |
| --- | --- |
| Quaternary ammonium surface active agent (TB-34, manufactured by Matsumoto Yushi Co. Ltd.) | 0.1 weight parts, |
| Isopropyl alcohol | 200 weight parts. |
| <Coating Liquid 2b for Antistatic Layer> | |
| Quaternary ammonium surface active agent (TB-34, manufactured by Matsumoto Yushi Co. Ltd.) | 0.1 weight parts, |
| Isopropyl alcohol | 200 weight parts. |

Each of the image receiving sheet of the above Example A-11 and Comparative Example A-3 were evaluated on the transferring of the antistatic agent, the dependency on circumstances of surface electrical resistance, the fixing ability of toner and the image quality by the following methods, and the results are shown in Table 2:

<Evaluation Methods>

(1) Transferring of the Antistatic Agent

A hundred of the image receiving sheets were piled, then horizontally placed and left under 40° C., 90% RH for 8 hours, then the surface resistant ratio was measured under 23° C., 60% RH. The standard of the evaluation were as follows:

◯: Difference of the surface resistant ratio under 23° C., 60% RH between before and after being left is under $1 \times 10^1$ Ω/cm²;

×: Difference of the surface resistant ratio under 23° C., 60% RH between before and after being left is at least $1 \times 10^1$ Ω/cm².

(2) Dependency on Circumstances of Surface Resistance

Respective image receiving sheet was left under the circumstances of 10° C., 20% RH; 23° C., 60% RH; and 30° C., 80% RH for one hour, respectively, and then the respective surface resistant ratio was measured.

(3) Fixing of the Toner

The color chart was copied by the full color duplicator (CLC-700 manufactured by Canon Co. Ltd.), then evaluated the fixing of the toner by means of peeling off with the use of the mending tape. The standard of the evaluation is as follows:

⊙: no peeling of the toner,

◯: almost no peeling of the toner,

Δ: partial peeling of the toner.

(4) Image Quality

The color chart was copied by the full color duplicator (CLC-700 manufactured by Canon Co. Ltd.), then evaluating qualities of the image. The standard of the evaluation were as follows:

◯: excellent in the color reproduction and no muddiness,

×: poor in the color reproduction and muddy.

TABLE 2

| | | Example A-11 | Comparative Example A-3 |
| --- | --- | --- | --- |
| Transferring of Antistatic Agent | | ◯ | × |
| Dependency | 10° C., 20% RH | $5 \times 10^{11}$ | $1 \times 10^{13}$ |
| on Circumstance | 23° C., 60% RH | $2 \times 10^{11}$ | $9 \times 10^{10}$ |
| of Surface Electrical Resistance | 30° C., 80% RH | $8 \times 10^{10}$ | $5 \times 10^{8}$ |
| Fixing Ability of Toner | | ⊙ | ◯ |
| Image Quality | 10° C., 20% RH | ◯ | × |
| | 23° C., 60% RH | ◯ | ◯ |
| | 30° C., 80% RH | ◯ | × |

As is shown in Table 2, since the quaternary ammonium surface active agent having a low molecular weight is used for the antistatic agent in Comparative Example A-3, the surface active agent becomes transferable toward the contact surface.

Example A-12

A transparent PET film having a thickness of 100 μm was selected as the substrate film, then the coating liquid 3a for the antistatic layer having the following composition was applied on the front surface side of the substrate film so as for the antistatic layer to have an applied amount of 0.5 g/m² when dried, thus prepared the antistatic layer:

| <Coating liquid 3a for Antistatic Layer> | |
| --- | --- |
| Sulfonated polyaniline (manufactured by Nitto Kagaku Kogyo Co. Ltd.) | 0.5 weight parts(in solid component) |
| Polyester resin (POLYESTER-WR-961, manufactured by Nihon Gosei Kagaku Kogyo Co. Ltd.) | 9.5 weight parts(in solid component) |
| Phosphoric ester surface active agent (PLYSURF 212C, manufactured by Daiichi Kogyo Seiyaku Go. Ltd.) | 0.2 weight parts(in solid component) |
| Water | 44.8 weight parts |
| Isopropyl alcohol | 45.0 weight parts. |

Then, the coating liquid 3 for the dye receptor layer having the following composition was applied on the surface of the above antistatic layer, and dried so as for the dye receptor layer to have an applied amount of 2.5 g/m² when dried, thus forming the dye receptor layer:

<Coating liquid 3 for Dye Receptor layer>

| | |
|---|---|
| Copolymer of vinyl chloride and vinyl acetate (#1000A, manufactured by Denki Kagaku Kogyou Co. Ltd.) | 19.6 weight parts(in solid component) |
| Silicone (X62-1212, manufactured by Shinetsu Kagaku Kogyou Co. Ltd.) | 2.0 weight parts(in solid component) |
| Catalyst (CAT-PL-50T, manufactured by Shinetsu Kagaku Kogyou Co. Ltd.) | 0.2 weight parts(in solid component) |
| MEK | 39.1 weight parts |
| Toluene | 39.1 weight parts. |

Then, the same antistatic back surface layer as in Example A-11 was formed on the back surface of the substrate film, thus obtaining the thermal transfer image receiving sheet used for the OHP.

Comparative Example A-4

The thermal transfer image receiving sheet for Comparative Example A-4 was prepared by the same manner as described in Example A-12, except that the following coating liquid 4a for the antistatic layer instead of the coating liquid 3a for the antistatic layer used in Example A-12:

<Coating Liquid 4a for Antistatic Layer>

| | |
|---|---|
| Cationic surface active agent (STATICIDE, manufactured by A.C.L. Co. Ltd.) | 0.2 weight parts(in solid component) |
| Isopropyl alcohol | 99.8 weight parts. |

Respective 10 sheets of the above Example A-12 and Comparative Example A-4 were continuously printed by the A-4 size sublimation transfer printer, and then evaluated the conveying ability and the accumulation property of electric charges. The results are shown in Table 3.

EXAMPLES OF SERIES B

Example B-1

The ink for the primer layer was prepared by mixing and dispersing the following compositions by the sand mill for one hour so as for the average particle size of the carbon black to be not more than 40 nm:

<Ink for Primer Layer>

| | |
|---|---|
| Carbon black (CB950, manufactured by Mitsubishi Kagaku Co. Ltd., primary particle size of 16 nm, specific surface of 250 m²/g, oil absorption of 80 ml/100 g) | 1.5 weight parts |
| Water soluble polyester resin (POLYESTER-WR-961, manufactured by Nihon Gosei Kagaku Kogyo Co. Ltd., 30 wt.% in solid component) | 3.5 weight parts (in solid component) |
| Water | 55.0 weight parts |
| Isopropyl alcohol | 40.0 weight parts. |

Thus prepared ink for the primer layer was applied on the back surface of the PET substrate sheet (a thickness of 6.0 μm, manufactured by Diafoil Co. Ltd.) by MAYER BAR #4 so as for the antistatic primer layer to have a thickness of 0.1

TABLE 3

| | | Surface Electrical Resistance (Ω) | | | | | |
|---|---|---|---|---|---|---|---|
| | | Before Printing | | After Printing | | | |
| | | 25° C., 50% RH | 5° C., 10% RH | 25° C., 50% RH | Conveying Ability | Others | Total Evaluation |
| Example A-12 | Front Surface | $9.0 \times 10^9$ | $9.0 \times 10^9$ | $8.7 \times 10^9$ | ○ | Note 1 | ○ |
| | Back Surface | $>1.0 \times 10^{13}$ | $>1.0 \times 10^{13}$ | $>1.0 \times 10^{13}$ | | | |
| Compararive Example A-4 | Front Surface | $3.0 \times 10^8$ | $5.0 \times 10^{10}$ | $1.0 \times 10^{13}$ | X | Note 2 | X |
| | Back Surface | $2.5 \times 10^8$ | $7.0 \times 10^{10}$ | $2.5 \times 10^8$ | | | |

Note 1: No Problem
Note 2: Jam Produced

μm (applied amount of 0.1 g/m²) when dried, then dried by the warm air, thus prepared the antistatic primer layer.

Then, the ink for the heat resistant slip layer having the following composition was applied on the surface of the above primer layer so as for the heat resistant slip layer to have a thickness of 1.0 μm when dried, then dried by the warm air, and further heated in the oven at the temperature of 60° C. for 5 days to be subjected to the hardening treatment, thus formed the heat resistant slip layer:

<Ink for Heat Resistant Slip Layer>

| | |
|---|---|
| Polyvinyl butyral resin (BX-1, manufactured by Sekisui Kagaku Co. Ltd.) | 80 weight parts |
| Polyisocyanate hardening agent (NCO/OH = 1.8) (TAKENATE D128, manufactured by Takeda Yakuhin Kogyo Co. Ltd.) | 35 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

On the other hand, the ink for the dye layer having the following composition was applied on the front surface of the PET substrate sheet by the gravure printing so as for the dye layer to have a thickness of 1.0 g/m² (applied amount) when dried, thus obtained the thermal transfer sheet of the present invention:

<Ink for Dye Layer>

| | |
|---|---|
| C.I. SOLVENT BLUE-22 | 5.50 weight parts |
| Acetoacetal resin | 3.00 weight parts |
| Methyl ethyl ketone | 22.54 weight parts |
| Toluene | 68.18 weight parts. |

Example B-2

The thermal transfer sheet of Example B-2 was obtained by the same manner described in Example B-1 except that the carbon black used in Example B-1 was substituted for CB970 (primary particle size of 16 nm, specific surface of 250 m²/g, oil absorption of 80 ml/100 g).

Example B-3

The thermal transfer sheet of Example B-3 was obtained by the same manner described in Example B-1 except that the following ink for the primer layer was used:

<Ink for Primer Layer>

| | |
|---|---|
| Carbon black (CARBON ECP, manufactured by Lion Co. Ltd., primary particle size of 30 nm, specific surface of 800 m²/g, oil absorption of 360 ml/100 g) | 1.0 weight parts |
| Water soluble polyester resin (POLYESTER-WR-961, manufactured by Nihon Gosei Kagaku Kogyo Co. Ltd., 30 wt.% in solid component) | 4.0 weight parts |
| Water | 55.0 weight parts |
| Isopropyl alcohol | 40.0 weight parts. |

Example B-4

The thermal transfer sheet of Example B-4 was obtained by the same manner described in Example B-1 except that the following ink for the primer layer was used:

<Ink for Primer Layer>

| | |
|---|---|
| Carbon black (CARBON ECP600JD, manufactured by Lion Co. Ltd., primary particle size of 30 nm, specific surface of 1200 m²/g, oil absorption of 490 ml/100 g) | 1.0 weight parts |
| Water soluble polyester resin (POLYESTER-WR-961, manufactured by Nihon Gosei Kagaku Kogyo Co. Ltd., 30 wt.% in solid component) | 4.0 weight parts, |
| Water | 55.0 weight parts |
| Isopropyl alcohol | 40.0 weight parts. |

Examples B-5, B-6, Comparative Examples B-1 to B-3

The respective thermal transfer sheet was obtained by the same manner as described in Example B-1 except the carbon black shown in Table 4 was used.

TABLE 4

| | Product Name of Carbon Black | Primary Particle Size (nm) | Specific Surface (m²/g) | Oil Absorption (ml/100 g) | Remarks |
|---|---|---|---|---|---|
| Example B-1 | CB 950 | 16 | 250 | 80 | Furnace, by Mitsubishi Kagaku |
| Example B-2 | CB 970 | 16 | 250 | 80 | Furnace, by Mitsubishi Kagaku |
| Example B-3 | CARBON ECP | 30 | 800 | 360 | Furnace, by Lion |
| Example B-4 | CARBON ECP 600 JD | 30 | 1200 | 490 | Furnace, by ion |
| Example B-5 | CONDUCTEX 975 | 21 | 270 | 170 | Furnace, by Columbian Carbon |
| Example B-6 | CONDUCTEX SC | 20 | 270 | 115 | Furnace, by Columbian Carbon |
| Comparative Example B-1 | CB 45 | 24 | 125 | 53 | Furnace, by Mitsubishi Kagaku |
| Comparative Example B-2 | CB 25 | 40 | 55 | 70 | Furnace, by Mitsubishi Kagaku |
| Comparative Example B-3 | SEVACARB MT - C1 | 350 | 8 | 41 | Thermal, by Columbian Carbon |

Example B-7

The thermal transfer sheet of the present invention was prepared by the same manner as described in Example B-1, except that the following ink was used instead of the ink for a heat resistant slip layer in Example B-1, and thus formed layer was irradiated to 5 Mrad of the electron ray at 180 KV of an accelerating voltage under the nitrogen gas atmosphere:

<Ink for Heat Resistant Slip Layer>

| | |
|---|---|
| Acryl modified polyvinyl butyral resin as shown in the above Manufacturing Example 1 | 50 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Example B-8

The thermal transfer sheet of the present invention was prepared by the same manner as described in Example B-2, except that the following ink was used instead of the ink for a heat resistant slip layer in Example B-2, and thus formed layer was irradiated to 5 Mrad of the electron ray at 180 KV of an accelerating voltage under the nitrogen gas atmosphere:

<Ink for Heat Resistant Slip Layer>

| | |
|---|---|
| Acryl modified polyvinyl butyral resin as shown in the above Manufacturing Example 2 | 50 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Example B-9

The thermal transfer sheet of the present invention was prepared by the same manner as described in Example B-3, except that the following ink was used instead of the ink for a heat resistant slip layer in Example B-3, and thus formed layer was irradiated to 5 Mrad of the electron ray at 180 KV of an accelerating voltage under the nitrogen gas atmosphere:

<Ink for Heat Resistant Slip Layer>

| | |
|---|---|
| Acryl modified polyvinyl butyral resin as shown in the above Manufacturing Example 3 | 50 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Example B-10

The thermal transfer sheet of the present invention was prepared by the same manner as described in Example B-4, except that the following ink was used instead of the ink for a heat resistant slip layer in Example B-4, and thus formed layer was irradiated to 5 Mrad of the electron ray at 180 KV of an accelerating voltage under the nitrogen gas atmosphere:

<Ink for Heat Resistant Slip Layer>

| | |
|---|---|
| Acryl modified polyvinyl butyral resin as shown in the above Manufacturing Example 4 | 50 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Example B-11

The thermal transfer sheet of the present invention was prepared by the same manner as described in Example B-5, except that the following ink was used instead of the ink for a heat resistant slip layer in Example B-5, and thus formed layer was irradiated to 5 Mrad of the electron ray at 180 KV of an accelerating voltage under the nitrogen gas atmosphere:

<Ink for Heat Resistant Slip Layer>

| | |
|---|---|
| Acryl modified polyvinyl butyral resin as shown in the above Manufacturing Example 1 | 50 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Example B-12

The thermal transfer sheet of the present invention was prepared by the same manner as described in Example B-6, except that the following ink was used instead of the ink for a heat resistant slip layer in Example B-6, and thus formed layer was irradiated to 5 Mrad of the electron ray at 180 KV of an accelerating voltage under the nitrogen gas atmosphere:

<Ink for Heat Resistant Slip Layer>

| | |
|---|---|
| Acryl modified polyvinyl butyral resin as shown in the above Manufacturing Example 4 | 50 weight parts |
| Phosphoric ester (PLYSURF A-208S, manufactured by Daiichi Kogyo Seiyaku Co. Ltd.) | 5 weight parts |
| Solvent (MEK/toluene = 1/1) | 500 weight parts. |

Various properties of each of the thus prepared antistatic layer and heat resistant slip layer were investigated before and after the heat resistant slip layer was formed by the following methods. The results are shown in Table 5.
<Evaluation Methods>
(1) Adhesiveness A mending tape (manufactured by Sumitomo 3M, a width of 18 mm) was stuck on the surface of the primer layer or the heat resistant slip layer, and then took the mending tape off those layers at once, then investigated the state of peeling off in the heat resistant slip layer and the antistatic primer layer, and evaluated as follows:

◯: no peeling off,

Δ: partially peeled off.

(2) Half Life

With the use of the Static electricity damping measure Model 406D (manufactured by American ETS Co. Ltd.), the voltage of 5 kv was impressed on the primer layer or the heat resistant slip layer, and stopped the impressing of the voltage, then investigated the time until the voltage in those layers decreased to 2.5 kv, and then evaluated as follows: up to 0.1 second for excellent antistatic property, wherein co shows that the voltage does not decrease below 5 kv.

(3) Surface Resistance

With the use of Hiresta Model HT-210 (manufactured by Mitsubishi Yuka Co. Ltd.), surface resistance were investigated, and evaluated as follows: up to $10^{10}$ Ω when impressed voltage was 500 v for excellent antistatic property.

(4) Ink Dispersion

With the use of the particle size distribution measure PAR-III (a dynamic optical dispersion method, manufactured by Ohtsuka Denshi Co. Ltd.), the particle size of the dispersed pigment in the ink was investigated, and evaluated the value of the avarage particle size as a degree of dispersion.

Each of the above-mentioned thermal transfer sheets of the present invention and for comparison was placed on the conventionally used thermal image-receiving sheet, and then, thus prepared sheets were thermally transferred by means of the thermal transfer recording apparatus under the following conditions to investigate the occurrence of the sticking between the thermal head and the thermal transfer sheet, the occurrence of wrinkles, the transferring of the dye (60° C., 17 g/m², 3 days), and the operability of the detecting mark. The results are shown in Table 6.

<Transfer Conditions>

| Pulse width | 1 ms |
| Recording cycle | 2.0 ms/line |
| Recording Energy | 3.0 J/cm². |

<Evaluation Methods>

(1) Occurrence of Sticking and Wrinkles: Observed with Eye (2) Transferring of Dye The dye layer was placed face to face on the heat resistant slip layer, then the pressure of 200 g/cm² was applied thereto, then after holding same at the temperature of 60° C. for 24 hours, investigated the transferring of the dye to the heat resistant slip layer and evaluated as follows:

◯: no transferring,

Δ: a little transferring was identified,

×: remarkably transferring.

TABLE 5

| Product Name of Carbon Black | Adhesiveness 1) Before | 2) After | Half Life (sec.) Before | After | Surface Resistance (Ω) Before | After | Degree of Dispersion (Average Particle Size) (nm) |
|---|---|---|---|---|---|---|---|
| Example B-1 | CB 950 | ◯ | ◯ | 0.01 | 0.03 | $10^{10}$ | $10^{8}$ | 158.3 |
| Example B-2 | CB 970 | ◯ | ◯ | 0.06 | 0.42 | >$10^{13}$ | $10^{12}$ | 134.6 |
| Example B-3 | CARBON ECP | ◯Δ | ◯Δ | 0.01 | ∞ | $10^{11}$ | $10^{12}$ | 248.9 |
| Example B-4 | CARBON ECP 600 JD | ◯Δ | ◯Δ | 0.01 | 0.01 | <$10^{7}$ | $10^{7}$ | 256.7 |
| Example B-5 | CONDUCTEX 975 | ◯Δ | ◯ | ∞ | ∞ | >$10^{13}$ | $10^{12}$ | not measured |
| Example B-6 | CONDUCTEX SC | ◯Δ | ◯ | ∞ | 0.02 | >$10^{13}$ | $10^{9}$ | not measured |
| Example B-7 | CB 950 | ◯ | ◯ | 0.01 | 0.03 | $10^{10}$ | $10^{8}$ | 158.3 |
| Example B-8 | CB 970 | ◯ | ◯ | 0.06 | 0.42 | >$10^{13}$ | $10^{12}$ | 134.6 |
| Example B-9 | CARBON ECP | ◯Δ | ◯Δ | 0.01 | ∞ | $10^{11}$ | $10^{12}$ | 248.9 |
| Example B-10 | CARBON ECP 600 JD | ◯Δ | ◯Δ | 0.01 | 0.01 | <$10^{7}$ | $10^{7}$ | 256.7 |
| Example B-11 | CONDUCTEX 975 | ◯Δ | ◯ | ∞ | ∞ | >$10^{13}$ | $10^{12}$ | not measured |
| Example B-12 | CONDUCTEX SC | ◯Δ | ◯ | ∞ | 0.02 | >$10^{13}$ | $10^{9}$ | not measured |
| Comparative Example B-1 | CB 45 | ◯ | ◯ | 0.12 | ∞ | >$10^{13}$ | >$10^{13}$ | 149.0 |
| Comparative Example B-2 | CB 25 | ◯ | ◯ | ∞ | ∞ | >$10^{13}$ | >$10^{13}$ | 202.2 |
| Comparative Example B-3 | SEVACARB MT-C1 | ◯Δ | ◯ | ∞ | ∞ | >$10^{13}$ | >$10^{13}$ | not measured |

1) Before: Before the heat resistant slip layer is formed.
2) After: After the heat resistant slip layer is formed.

(3) Operability of the Detecting Mark

With the use of UV-3100 (manufactured by Shimazu Seisakusho Co. Ltd.), a transmittance of the light having 950 nm wavelength against the printed matter was investigated, and evaluated as follows: at least 65% of the transmittance shows that the detecting mark excellently functions, causing no problem.

TABLE 6

|  | Occurrence of Sticking and Wrinkles | Transferring of Dye | Operability of Detecting Mark |
|---|---|---|---|
| Example B-1 | NONE | ○ | No Problem |
| Example B-2 | NONE | ○ | No Problem |
| Example B-3 | NONE | ○ | No Problem |
| Example B-4 | NONE | ○ | No Problem |
| Example B-5 | NONE | ○ | No Problem |
| Example B-6 | NONE | ○ | No Problem |
| Example B-7 | NONE | ○ | No Problem |
| Example B-8 | NONE | ○ | No Problem |
| Example B-9 | NONE | ○ | No Problem |
| Example B-10 | NONE | ○ | No Problem |
| Example B-11 | NONE | ○ | No Problem |
| Example B-12 | NONE | ○ | No Problem |
| Comparative Example B-1 | Wrinkles partially occurred | ○ | No Problem |
| Comparative Example B-2 | Wrinkles partially occurred | ○ | No Problem |
| Comparative Example B-3 | Wrinkles partially occurred | ○ | No Problem |

What is claimed is:

1. A thermal transfer sheet comprising a substrate film, a coloring material layer disposed on a front surface side of said substrate film, and a heat resistant slip layer disposed on a back surface side of said substrate film, said heat resistant slip layer containing a binder resin and an organic or inorganic conductive material, and said heat resistant slip layer having antistatic property.

2. A thermal transfer sheet as claimed in claim 1, wherein said conductive material comprises a conductive polymer having $\pi$-electron conjugated system.

3. A thermal transfer sheet as claimed in claim 2, wherein said conductive polymer having $\pi$-electron conjugated system comprises sulfonated polyaniline.

4. A thermal transfer sheet as claimed in claim 3, wherein a particle size of said sulfonated polyaniline is within a range of 0.01 to 1.0 $\mu$m.

5. A thermal transfer sheet as claimed in claim 1, wherein said conductive material comprises a conductive carbon black.

6. A thermal transfer sheet as claimed in claim 5, wherein a primary particle size of said conductive carbon black is up to 40 nm, and a specific surface of said conductive carbon black is at least 130 $m^2$ g.

7. A thermal transfer sheet as claimed in claim 5, wherein an oil absorption of said conductive carbon black is at least 75 ml/100 g.

8. A thermal transfer sheet as claimed in claim 5, wherein a primary particle size of said conductive carbon black is up to 40 nm, a specific surface of said conductive carbon black is at least 130 $m^2$/g, and an oil absorption of said conductive carbon black is at least 75 ml/100 g.

9. A thermal transfer sheet as claimed in claim 5, wherein there is disposed further on the front surface side at said substrate film a detecting mark being adjacent to said coloring material layer, and said antistatic layer containing said conductive carbon. black is patterned in such a shape as not to hide said detecting mark.

10. A thermal transfer sheet as claimed in claim 1, wherein said heat resistant slip layer comprises, as said binder resin, a reaction product produced in a reaction of a thermoplastic resin with a polyisocyanate.

11. A thermal transfer sheet as claimed in claim 1, wherein said heat resistant slip layer comprises, as said binder resin, an acryl modified polyvinyl butyral.

12. A thermal transfer sheet as claimed in claim 1, wherein a thickness of said heat resistant slip layer is within a range of 0.1 to 2.0 $\mu$m.

* * * * *